United States Patent
Yang et al.

(10) Patent No.: US 10,291,224 B2
(45) Date of Patent: May 14, 2019

(54) GATE DRIVING CIRCUIT, DRIVING METHOD THEREOF, DISPLAY PANEL AND DISPLAY DEVICE

(71) Applicant: BOE TECHNOLOGY GROUP CO., LTD., Beijing (CN)

(72) Inventors: Fei Yang, Beijing (CN); Zhongyuan Wu, Beijing (CN); Yue Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/737,111

(22) PCT Filed: Jun. 7, 2017

(86) PCT No.: PCT/CN2017/087379
§ 371 (c)(1),
(2) Date: Dec. 15, 2017

(87) PCT Pub. No.: WO2017/211282
PCT Pub. Date: Dec. 14, 2017

(65) Prior Publication Data
US 2018/0175854 A1    Jun. 21, 2018

(30) Foreign Application Priority Data

Jun. 7, 2016    (CN) .......................... 2016 1 0403655

(51) Int. Cl.
*H03K 17/00* (2006.01)
*H03K 17/30* (2006.01)
(Continued)

(52) U.S. Cl.
CPC ............. *H03K 17/30* (2013.01); *G06F 3/147* (2013.01); *G09G 3/3208* (2013.01);
(Continued)

(58) Field of Classification Search
CPC .... A61F 2009/00872; A61F 2009/0088; A61F 2009/00882; A61F 2009/00848
See application file for complete search history.

(56) References Cited

U.S. PATENT DOCUMENTS

2008/0084379 A1    4/2008 Takahashi et al.
2009/0273591 A1    11/2009 Jinta
(Continued)

FOREIGN PATENT DOCUMENTS

CN    102129845    7/2011
CN    102708822    10/2012
(Continued)

OTHER PUBLICATIONS

Chinese Search Report with English Language Translation, dated Sep. 23, 2016, Chinese Application No. 201610403655.2.
(Continued)

*Primary Examiner* — Sibin Chen
(74) *Attorney, Agent, or Firm* — Womble Bond Dickinson (US) LLP

(57) ABSTRACT

Embodiments of this disclosure provide a gate driving circuit, a driving method thereof, a display panel and a display device. The gate driving circuit comprises: a corner cutting circuit and a scanning circuit. The corner cutting circuit is configured to output a corner cut voltage signal, wherein the corner cut voltage signal comprises a pulse whose edge is smoothed. The scanning circuit is configured to output a corner cut scanning signal based on the corner cut voltage signal, wherein the corner cut scanning signal comprises a pulse whose edge is smoothed.

20 Claims, 8 Drawing Sheets

(51) Int. Cl.
  *G09G 3/3208* (2016.01)
  *G06F 3/147* (2006.01)
  *H03K 19/21* (2006.01)
  *G09G 3/3233* (2016.01)
  *G09G 3/3266* (2016.01)
  *G11C 19/28* (2006.01)

(52) U.S. Cl.
  CPC ......... *G09G 3/3233* (2013.01); *G09G 3/3266* (2013.01); *G11C 19/28* (2013.01); *H03K 19/21* (2013.01); *G09G 2310/0286* (2013.01); *G09G 2310/066* (2013.01); *G09G 2320/0219* (2013.01); *H03K 2217/0054* (2013.01)

(56) References Cited

U.S. PATENT DOCUMENTS

2011/0169796 A1* 7/2011 Guo ................... G09G 3/3677
                                                      345/208

| 2014/0219412 | A1 | 8/2014 | Chien et al. |
| 2017/0076657 | A1 | 3/2017 | Lu et al. |
| 2017/0213514 | A1 | 7/2017 | Xie |

FOREIGN PATENT DOCUMENTS

| CN | 104123922 | 10/2014 |
| CN | 104778937 | 7/2015 |
| CN | 105070243 | 11/2015 |
| CN | 105374337 | 3/2016 |
| CN | 105513552 | 4/2016 |
| CN | 105825814 | 8/2016 |

OTHER PUBLICATIONS

International Search Report with English Language Translation, dated Sep. 5, 2017, Application No. PCT/CN2017/087379.
Office Action received for Chinese Patent Application No. 201610403655.2, dated Dec. 6, 2016, 9 pages (4 pages of English Translation and 5 pages of original Document).

* cited by examiner

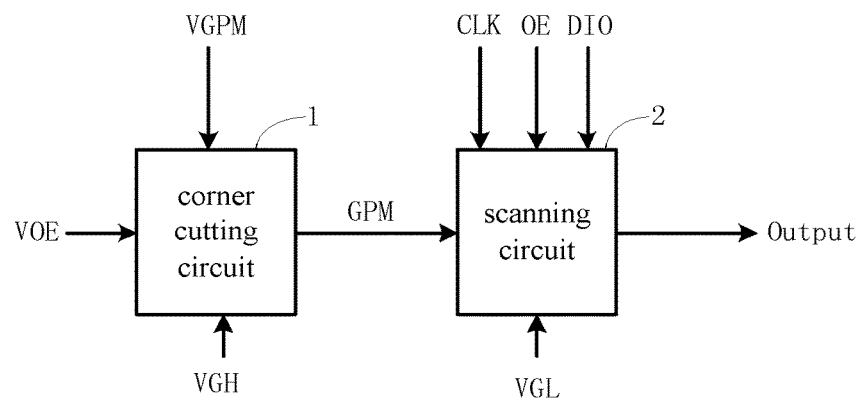

Fig.3

| the corner cutting circuit controls the first output signal terminal to output the corner cut voltage signal based on a signal of the first input signal terminal under control of the first control signal terminal | S401 |

| the scanning circuit controls the second output signal terminal to output the corner cut scanning signal row by row based on the corner cut voltage signal outputted by the first output signal terminal under control of the clock signal terminal, the second control signal terminal and the second input signal terminal | S402 |

Fig.4

GATE DRIVING CIRCUIT, DRIVING METHOD THEREOF, DISPLAY PANEL AND DISPLAY DEVICE

CROSS REFERENCE OF RELATED APPLICATIONS

The present application is the U.S. national phase entry of PCT/CN2017/087379, with an international filing date of Jun. 7, 2017, which claims priority of Chinese patent application No. 201610403655.2 filed on Jun. 7, 2016, the entire disclosure of which is incorporated herein by reference as a part of the present application.

FIELD

Embodiments of this disclosure relate to the field of display technology, particularly to a gate driving circuit, a driving method thereof, a display panel and a display device.

BACKGROUND

In an existing display device, the technology of driving the pixel array by scanning has been widely applied.

Nevertheless, the display device still has improvement space.

SUMMARY

Embodiments of this disclosure provide a gate driving circuit, a driving method thereof, a display panel and a display device.

According to a first aspect, an embodiment of this disclosure provides a gate driving circuit, comprising: a corner cutting circuit and a scanning circuit. The corner cutting circuit is configured to output a corner cut voltage signal, wherein the corner cut voltage signal comprises a pulse whose edge is smoothed. The scanning circuit is configured to output a corner cut scanning signal based on the corner cut voltage signal, wherein the corner cut scanning signal comprises a pulse whose edge is smoothed.

In an embodiment of this disclosure, a first terminal of the corner cutting circuit is connected with a first control signal terminal, a second terminal of the corner cutting circuit is connected with a first input signal terminal, a third terminal of the corner cutting circuit is connected with a first power supply signal terminal, a fourth terminal of the corner cutting circuit is connected with a first output signal terminal. The corner cutting circuit is configured to control the first output signal terminal to output the corner cut voltage signal based on a signal from the first input signal terminal under control of a signal from the first control signal terminal. A first terminal of the scanning circuit is connected with the first output signal terminal of the corner cutting circuit, a second terminal of the scanning circuit is connected with a clock signal terminal, a third terminal of the scanning circuit is connected with a second input signal terminal, a fourth terminal of the scanning circuit is connected a second control signal terminal, a fifth terminal of the scanning circuit is connected with a second power supply signal terminal, a sixth terminal of the scanning circuit is connected with a second output signal terminal. The scanning circuit is configured to control the second output signal terminal to output the corner cut scanning signal based on the corner cut voltage signal outputted by the first output signal terminal under control of signals from the clock signal terminal, the second control signal terminal and the second input signal terminal.

In an embodiment of this disclosure, the corner cutting circuit comprises: a comparator, an XOR gate circuit, a first switch transistor, a second switch transistor and a resistor. A first input terminal of the comparator is connected with the first input signal terminal, a second input terminal of the comparator is connected with the first output signal terminal, an output terminal of the comparator is connected with a first input terminal of the XOR gate circuit. A second input terminal of the XOR gate circuit is connected with the first control signal terminal and a control pole of the first switch transistor, an output terminal of the XOR gate circuit is connected with a control pole of the second switch transistor. A first pole of the first switch transistor is connected with the first power supply signal terminal. A first pole of the second switch transistor is connected with a second pole of the first switch transistor and the first output signal terminal respectively. One terminal of the resistor is connected with a second pole of the second switch transistor, the other terminal of the resistor is connected to the ground.

In an embodiment of this disclosure, the scanning circuit comprises a plurality of cascaded logic shift circuits, and a plurality of level modulation circuits connected with the plurality of logic shift circuits correspondingly. Each of the plurality of logic shift circuits is configured to, in response to a signal from the second input signal terminal and a clock signal from the clock signal terminal, output a signal from the second control signal terminal to a corresponding level modulation circuit, and shift and output the signal from the second input signal terminal to a next stage of logic shift circuit. Each of the plurality of level modulation circuits is configured to, in response to the signal from the second control signal terminal, selectively output a signal from the first output signal terminal or from the second power supply signal terminal.

In an embodiment of this disclosure, in the gate driving circuit provided by embodiments of this disclosure, the corner cutting circuit comprises a first corner cutting circuit and a second corner cutting circuit. The scanning circuit comprises a first scanning circuit connected with the first corner cutting circuit, and a second scanning circuit connected with the second corner cutting circuit. The first scanning circuit comprises a plurality of cascaded logic shift circuits and corresponding level modulation circuits located in even rows. The second scanning circuit comprises a plurality of cascaded logic shift circuits and corresponding level modulation circuits located in odd rows.

In an embodiment of this disclosure, in the gate driving circuit provided by embodiments of this disclosure, a first terminal of the first corner cutting circuit inputs a first enable control signal, a second terminal of the first corner cutting circuit inputs a first input signal, a third terminal of the first corner cutting circuit input a first power supply signal, and a fourth terminal of the first corner cutting circuit outputs a first output signal. A first terminal of the second corner cutting circuit inputs a second enable control signal, a second terminal of the second corner cutting circuit inputs the first input signal, a third terminal of the second corner cutting circuit input the first power supply signal, and a fourth terminal of the second corner cutting circuit outputs a second output signal.

In an embodiment of this disclosure, in the gate driving circuit provided by embodiments of this disclosure, a first terminal of the first scanning circuit inputs the first output signal, a second terminal of the first scanning circuit inputs a first clock signal, a third terminal of the first scanning circuit inputs a second input signal, a fourth terminal of the first scanning circuit inputs a third enable control signal, a fifth terminal of the first scanning circuit inputs a second power supply signal, and a sixth terminal of the first scanning circuit outputs a third output signal. A first terminal of the second scanning circuit inputs the second output signal, a second terminal of the second scanning circuit inputs a second clock signal, a third terminal of the second scanning circuit inputs a third input signal, a fourth terminal of the second scanning circuit inputs a fourth enable control signal, a fifth terminal of the second scanning circuit inputs the second power supply signal, and a sixth terminal of the second scanning circuit outputs a fourth output signal.

According to a second aspect, an embodiment of this disclosure further provides a driving method of the gate driving circuit provided by embodiments of this disclosure, comprising: controlling, by the corner cutting circuit, the first output signal terminal to output the corner cut voltage signal based on a signal of the first input signal terminal under control of a signal from the first control signal terminal; controlling, by the scanning circuit, the second output signal terminal to output the corner cut scanning signal based on the corner cut voltage signal outputted by the first output signal terminal under control of signals from the clock signal terminal, the second control signal terminal and the second input signal terminal.

In an embodiment of this disclosure, outputting the corner cut voltage signal comprises: in response to a high level signal from the first control signal terminal, outputting a high level signal at the first output signal terminal; in response to a low level signal from the first control signal terminal, outputting a signal whose voltage value is smoothly reduced at the first output signal terminal, the voltage value of the signal being reduced from a high level to a voltage value of the first input signal terminal.

In an embodiment of this disclosure, outputting the corner cut scanning signal comprises: in response to the voltage of the second input signal terminal being of a high level at a rising edge of a clock signal of the clock signal terminal, outputting, by the logic shift circuit, a signal from the second control signal terminal to a corresponding level modulation circuit within a clock cycle where the rising edge locates, and shifting and outputting the signal of the second input signal terminal to a next stage of logic shift circuit; in response to a low level signal from the second control signal terminal, outputting, by the level modulation circuit, a signal from the second power supply signal terminal, and in response to a high level signal from the second control signal terminal, outputting, by the level modulation circuit, a signal from the first output signal terminal.

In an embodiment of this disclosure, outputting the corner cut scanning signal comprises:

in a first phase, the low level signal from the second control signal terminal is outputted to a corresponding level modulation circuit, and the level modulation circuit outputs the signal from the second power supply signal terminal;

in a second phase, the high level signal from the second control signal terminal is outputted to a corresponding level modulation circuit, and the level modulation circuit outputs the signal from the first output signal terminal, wherein in response to the high level signal from the first control signal terminal, a high level signal is outputted at the first output signal terminal;

in a third phase, the high level signal from the second control signal terminal is outputted to a corresponding level modulation circuit, and the level modulation circuit outputs the signal from the first output signal terminal, wherein in response to the low level signal from the first control signal terminal, the signal whose voltage value is smoothly reduced is outputted at the first output signal terminal, the voltage value of the signal being reduced from a high level to the voltage value of the first input signal terminal;

in a fourth phase, the low level signal from the second control signal terminal is outputted to a corresponding level modulation circuit, and the level modulation circuit outputs the signal from the second power supply signal terminal, wherein, in response to the voltage of the second input signal terminal being of a high level at the rising edge of the clock signal of the clock signal terminal, the first phase starts, and the first phase to the fourth phase constitute a clock cycle where the rising edge locates.

In an embodiment of this disclosure, the corner cutting circuit comprises a first corner cutting circuit and a second corner cutting circuit. The scanning circuit comprises a first scanning circuit connected with the first corner cutting circuit, and a second scanning circuit connected with the second corner cutting circuit. The first scanning circuit comprises a plurality of cascaded logic shift circuits and corresponding level modulation circuits located in even rows. The first scanning circuit controls the second output signal terminal to output the corner cut scanning signal row by row in all even rows based on the corner cut voltage signal outputted by the first output signal terminal controlled by the first corner cutting circuit under control of signals from the clock signal terminal, the second control signal terminal and the second input signal terminal. The second scanning circuit comprises a plurality of cascaded logic shift circuits and corresponding level modulation circuits located in odd rows. The second scanning circuit controls the second output signal terminal to output the corner cut scanning signal row by row in all odd rows based on the corner cut voltage signal outputted by the first output signal terminal controlled by the second corner cutting circuit under control of signals from the clock signal terminal, the second control signal terminal and the second input signal terminal.

According to a third aspect, an embodiment of this disclosure further provides a display panel, comprising the gate driving circuit provided by embodiments of this disclosure.

According to a fourth aspect, an embodiment of this disclosure further provides a display device, comprising the display panel provided by the embodiment of this disclosure.

BRIEF DESCRIPTION OF DRAWINGS

In order to explain the technical solutions of embodiments of this disclosure more clearly, next, drawings of the embodiments will be introduced briefly. It should be aware that the drawings described below only relate to some embodiments of this disclosure, rather than limitations to this disclosure, wherein:

FIG. 3 is a structural schematic diagram of a gate driving circuit provided by an embodiment of this disclosure;

FIG. 4 is a flow chart of a driving method of a gate driving circuit provided by an embodiment of this disclosure;

DETAILED DESCRIPTION

Next, specific implementations of the gate driving circuit, the driving method thereof, the display panel and the display device provided by embodiments of this disclosure will be explained in detail in conjunction with the drawings. Apparently, the embodiments described are only a part of rather than all of the embodiments of this disclosure. Based on the embodiments of this disclosure, other embodiments obtained by the ordinary skilled person in the art on the premise of not paying any inventive effort all belong to the protection scope of this disclosure.

The scanning driving will be explained below briefly by taking a common organic light emitting display (OLED) device as an example.

Figure 1:
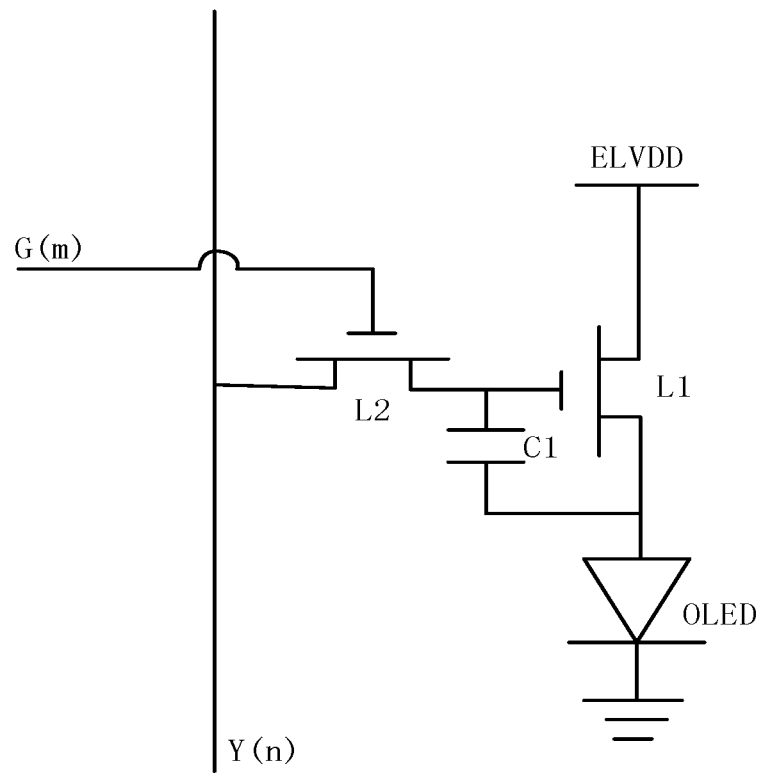
FIG. 1 is a schematic diagram of a pixel circuit.

FIG. 1 is a schematic diagram of a pixel circuit. As an example, FIG. 1 shows a pixel of the m-th row and the n-th column in a pixel array. As shown in FIG. 1, the pixel circuit comprises a driving transistor L1, a switch transistor L2, a capacitor C1, and an OLED device. The pixel circuit is powered by a power supply ELVDD, and operates under the driving of signals on a data line Y(n) of the n-th column and a scanning line G(m) of the m-th row. In the structure as shown in FIG. 1, due to the manufacturing process and design, a parasitic capacitance $C_{gs}$ (not shown in the figure) will be generated between a gate and a source of the switch transistor L2.

Figure 2:
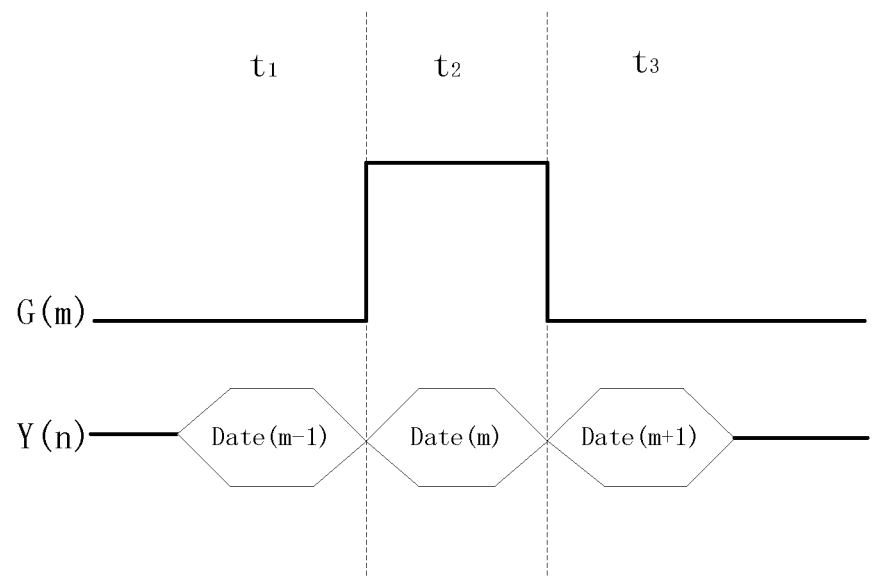
FIG. 2 is a waveform diagram of signals on a data line and a scanning line in FIG. 1.

FIG. 2 is a waveform diagram of the signals on the data line and the scanning line in FIG. 1. As shown in FIG. 2, in the first time period t1, it is a low gate driving voltage VGL on the scanning line G(m), so that the switch transistor L2 in FIG. 1 is cut off. A data signal Data(m−1) of the (m−1)-th row is transmitted on the data line Y(n), and the data signal Data(m−1) will not pass through the switch transistor L2 in FIG. 1. In the second time period t2, it is a high gate driving voltage VGH on the scanning line G(m), so that the switch transistor L2 in FIG. 1 is turned on. A data signal Data(m) of the m-th row is transmitted on the data line Y(n), and the data signal Data(m) passes through the switch transistor L2 and is stored in the capacitor C1. In the third time period t3, it is a low gate driving voltage VGL on the scanning line G(m), so that the switch transistor L2 in FIG. 1 is cut off. The data line Y(n) stops transmitting the data signal Data(m) of the m-th row, and starts transmitting a data signal Data(m+1) of the (m+1)-th row. At the boundary of the second time period t2 and the third time period t3 (i.e., the cut off time instant of the switch transistor L2, hereinafter referred to as the cut off time instant), the voltage on the scanning line G(m) becomes the low gate driving voltage VGL from the high gate driving voltage VGH, here the voltage change amount of the scanning line G(m) is VGL−VGH, i.e., the voltage change amount on the gate of the switch transistor L2 is VGL−VGH. Since there is the parasitic capacitance $C_{gs}$ between the gate and the source of the switch transistor L2, the voltage on the source of the switch transistor L2 will also be changed accordingly. The voltage change on the source of the switch transistor L2 will also be stored in the capacitor C1, which influences the data signal stored therein, such that distortion may occur to a display image.

FIG. 3 is a structural schematic diagram of a gate driving circuit provided by an embodiment of this disclosure. As shown in FIG. 3, the gate driving circuit comprises: a corner cutting circuit 1 and a scanning circuit 2. The corner cutting circuit 1 is configured to output a corner cut voltage signal, wherein the corner cut voltage signal comprises a pulse whose edge is smoothed. The scanning circuit 2 is configured to output a corner cut scanning signal based on the corner cut voltage signal, wherein the corner cut scanning signal comprises a pulse whose edge is smoothed.

According to an embodiment of this disclosure, the corner cutting circuit 1 and the scanning circuit 2 in the gate driving circuit cooperate with each other, so as to enable the waveform of the scanning signal to be a corner cutting waveform, which reduces influence caused by the waveform of the scanning signal to the voltage of the data signal, improves image quality, and can be used in a display device of a high resolution.

Specifically, a first terminal of the corner cutting circuit 1 is connected with a first control signal terminal VOE, a second terminal of the corner cutting circuit is connected with a first input signal terminal VGPM, a third terminal of the corner cutting circuit is connected with a first power supply signal terminal VGH, and a fourth terminal of the corner cutting circuit is connected with a first output signal terminal GPM. The corner cutting circuit 1 is configured to control the first output signal terminal GPM to output a corner cut voltage signal based on a signal from the first input signal terminal VGPM under control of the first control signal terminal VOE. A first terminal of the scanning circuit 2 is connected with the first output signal terminal GPM of the corner cutting circuit 1, a second terminal of the scanning circuit is connected with a clock signal terminal CLK, a third terminal of the scanning circuit is connected with a second input signal terminal DIO, a fourth terminal of the scanning circuit is connected with a second control signal terminal OE, a fifth terminal of the scanning circuit is connected with a second power supply signal terminal VGL, and a sixth terminal of the scanning circuit is connected with a second output signal terminal Output. The scanning circuit 2 is configured to control the second output signal terminal Output to output a corner cut scanning signal row by row based on the corner cut voltage signal outputted by the first output signal terminal GPM under control of the clock signal terminal CLK, the second control signal terminal OE and the second input signal terminal DIO.

FIG. 4 is a flow chart of a driving method of a gate driving circuit provided by an embodiment of this disclosure. As shown in FIG. 4, the driving method of the gate driving circuit comprises the steps of:

At S401, controlling, by the corner cutting circuit, the first output signal terminal to output a corner cut voltage signal based on a signal of the first input signal terminal under control of a signal from the first control signal terminal;

At S402, controlling, by the scanning circuit, the second output signal terminal to output a corner cut scanning signal row by row based on the corner cut voltage signal outputted by the first output signal terminal under control of signals of the clock signal terminal, the second control signal terminal and the second input signal terminal.

Figure 5:
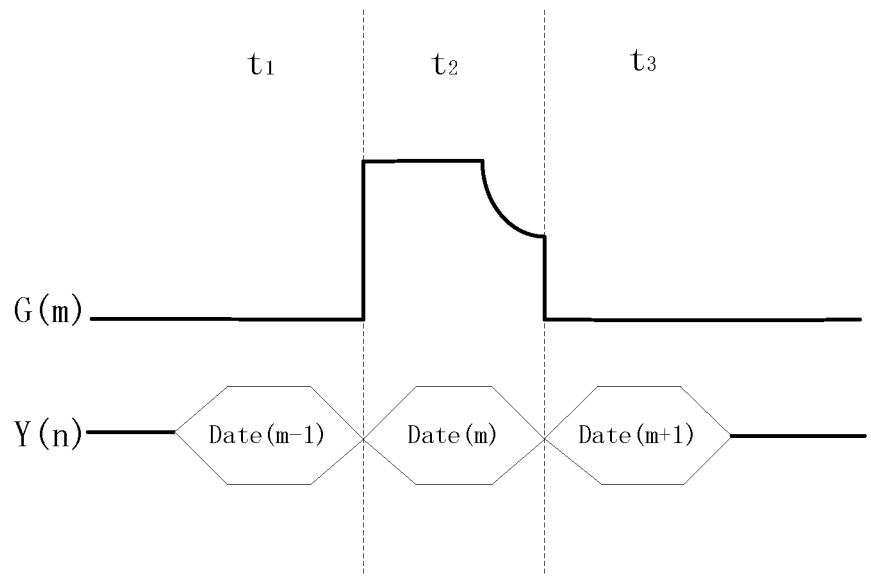
FIG. 5 is a waveform diagram of a data line and a scanning line in an embodiment of this disclosure.

FIG. 5 is a waveform diagram of a data line and a scanning line in an embodiment of this disclosure. As shown in FIG. 5, in a second time period t2, a scanning signal is corner cut, i.e., the scanning signal comprises a pulse whose falling edge is smoothed. At the boundary of the second time period t2 and a third time period t3 (i.e., the cut off time instant of the switch transistor L2 in FIG. 1), the voltage change amount on a scanning line G(m) is reduced, which can reduce influence on a data signal.

Specifically, at the boundary of the second time period t2 and the third time period t3, the voltage of the scanning line G(m) becomes a low gate driving voltage VGL from a corner cut voltage (which is set as VGPM), here the voltage change amount of the scanning line G(m) is VGL−VGPM. Due to the influence of the parasitic capacitance Cgs, the voltage change amount at a data capacitor C1 is $$\Delta V=(VGL-VGPM)*C_{gs}/(C_{gs}+C1).$$

While the voltage change amount at the storage capacitor C1 in FIG. 2 is $$\Delta V=(VGL-VGH)*C_{gs}/(C_{gs}+C1).$$

Since the absolute value of VGL−VGPM can be much smaller than the absolute value of VGL−VGH, the value of ΔV can be reduced effectively under the driving of the scanning signal as shown in FIG. 5, thereby reducing the influence caused to the voltage of the data signal effectively. In addition, embodiments of this disclosure can provide a longer ON time of the switch transistor and prolong the writing time of the data signal, so as to meet the requirement on the ON time of the switch transistor when using the corner cut waveform under the condition of high resolution.

Figure 6:
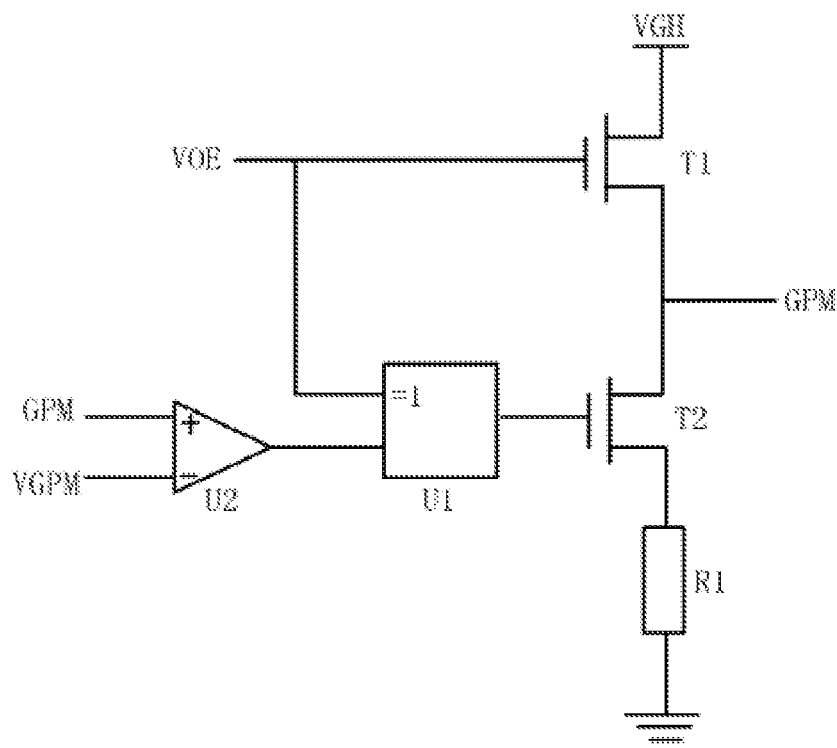
FIG. 6 is a schematic diagram of a specific structure of a corner cutting circuit in a gate driving circuit provided by an embodiment of this disclosure.

FIG. 6 is a schematic diagram of a specific structure of a corner cutting circuit in a gate driving circuit provided in an embodiment of this disclosure. As shown in FIG. 6, the corner cutting circuit 1 may specifically comprise an XOR circuit U1, a comparator U2, a first switch transistor T1, a second switch transistor T2 and a resistor R1. A first input terminal of the comparator U2 is connected with the first input signal terminal VGPM, a second input terminal of the comparator U2 is connected with the first output signal terminal GPM, and an output terminal of the comparator U2 is connected with a first input terminal of the XOR circuit U1. A second input terminal of the XOR circuit U1 is connected with the first control signal terminal VOE and a control pole of the first switch transistor T1 respectively, and an output terminal of the XOR circuit U1 is connected with a control pole of the second switch transistor T2. A first pole of the first switch transistor T1 is connected with the first power supply signal terminal VGH. A first pole of the second switch transistor T2 is connected with a second pole of the first switch transistor T1 and the first output signal terminal GPM respectively. One terminal of the resistor R1 is connected with a second pole of the second switch transistor T2, and the other terminal of the resistor R1 is connected to the ground.

The specific structure of the corner cutting circuit in the gate driving circuit is just explained exemplarily above. In specific implementation, the specific structure of the corner cutting circuit is not limited to the above structure provided by an embodiment of this disclosure, and it can also be other structures known by the skilled person in the art, which will not be defined here. In addition, it should be understood that the control pole can be a gate of the switch transistor, the first pole can be one of a source and a drain of the switch transistor, and the second pole can be the other of the source and the drain of the switch transistor.

Figure 7:
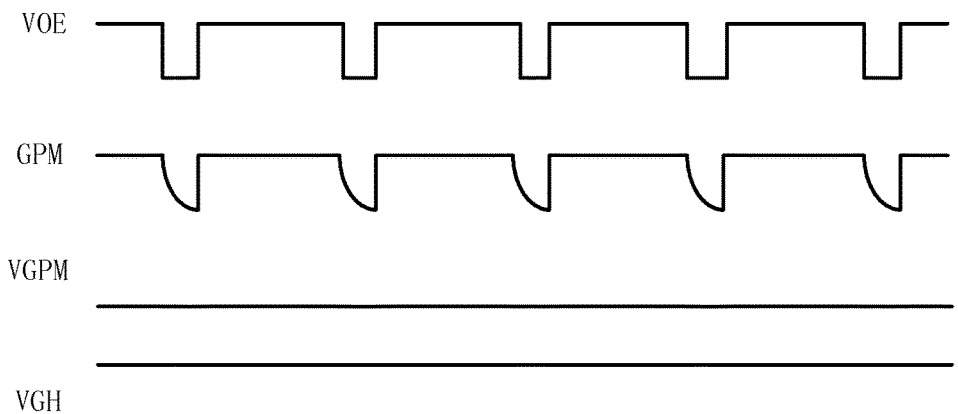
FIG. 7 is a timing diagram of a corner cutting circuit in a gate driving circuit provided by an embodiment of this disclosure.

FIG. 7 is a timing diagram of a corner cutting circuit in a gate driving circuit provided by an embodiment of this disclosure. As shown in FIG. 7, a working process of the corner cutting circuit may comprise: in response to a high level signal from the first control signal terminal VOE, outputting a high level signal at the first output signal terminal GPM; in response to a low level signal from the first control signal terminal VOE, outputting a signal whose voltage value is smoothly reduced at the first output signal terminal GPM, the voltage value of the signal being reduced from a high level of the first power supply signal terminal VGH to a voltage value of the first input signal terminal VGPM. In an embodiment of this disclosure, the first input signal terminal VGPM may input a voltage signal with a preset voltage value.

Specifically, assuming all the switch transistors are N-type transistors, if the first control signal terminal VOE is of a high level, the comparator U2 outputs a high level, and the XOR circuit U1 outputs a low level. Here, the first switch transistor T1 is turned on, the second switch transistor T2 is cut off, and the first output signal terminal GPM outputs a high level voltage of the first power supply signal terminal VGH. If the first control signal terminal VOE is of a low level, the XOR circuit U1 outputs a high level. Here, the first switch transistor T1 is cut off, the second switch transistor T2 is turned on, and the voltage outputted by the first output signal terminal GPM will be reduced from the high level due to the discharging effect of the resistor R1. Within initial time, the voltage of the first output signal terminal GPM is still larger than the preset voltage of the first input signal terminal VGPM. If the voltage of the first output signal terminal GPM is lower than the preset voltage of the first input signal terminal VGPM, the XOR circuit U2 outputs a low level. Here, the second switch transistor T2 is cut off, thereby the voltage of the first output signal terminal GPM will not perform the action of discharging through the resistor R1. Hence, the minimum value of the voltage of the first output signal terminal GPM can be made equal to the preset voltage value of the first input signal terminal VGPM, so as to achieve the purpose of stabilizing the voltage of the first output signal terminal GPM.

Figure 8:
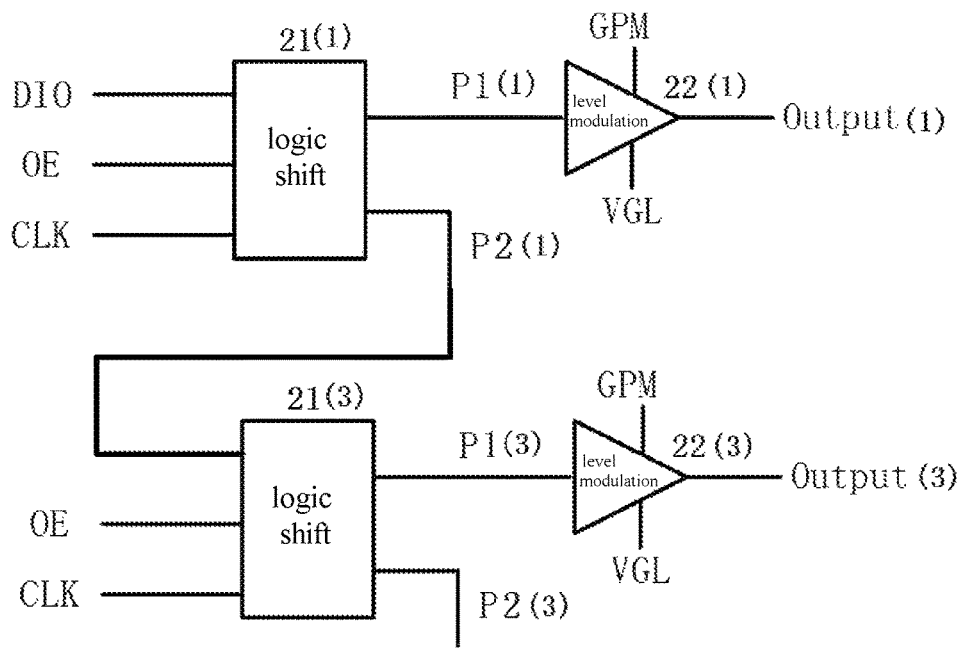
FIG. 8 is schematic diagram of a specific structure of a scanning circuit in a gate driving circuit provided by an embodiment of this disclosure.

FIG. 8 is a schematic diagram of a specific structure of a scanning circuit in a gate driving circuit provided by an embodiment of this disclosure. As shown in FIG. 8, the scanning circuit comprises a plurality of cascaded logic shift circuits 21, and a plurality of level modulation circuits 22 connected with the plurality of logic shift circuits 21 correspondingly. Each of the plurality of logic shift circuits 21 is configured to, in response to a signal from the second input signal terminal DIO and a clock signal from the clock signal terminal CLK, output a signal from the second control signal terminal OE to a corresponding level modulation circuit 22, and shift and output the signal from the second input signal terminal DIO to a next stage of logic shift circuit 21. The level modulation circuit 22 is configured to, in response to the signal from the second control signal terminal OE, selectively output a signal from the first output signal terminal GPM or a signal from the second power supply signal terminal VGL.

It should be understood that as an example, FIG. 8 shows the logic shift circuits 21 that are cascaded with each other and correspond to pixel circuits of odd rows (e.g., the first row and the third row shown in the figure) as well as the corresponding level modulation circuits 22.

Figure 9:
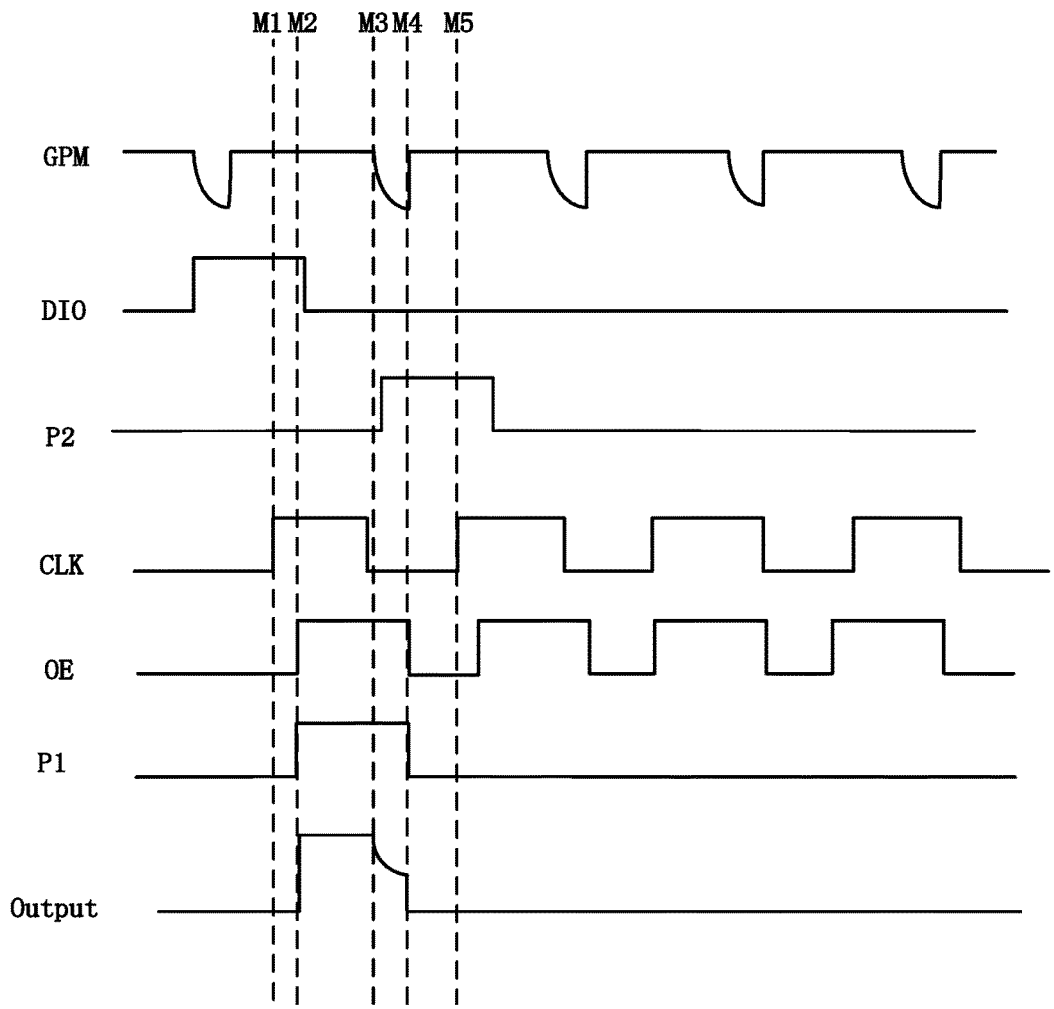
FIG. 9 is a timing diagram of a scanning circuit in a gate driving circuit provided by an embodiment of this disclosure.

FIG. 9 is a timing diagram of a scanning circuit in a gate driving circuit provided by an embodiment of this disclosure. As shown in FIG. 9, a working process of the logic shift circuit 21 comprises: at time instant M1 in FIG. 9, in response to the voltage of the second input signal terminal DIO being of a high level at a rising edge of the clock signal of the clock signal terminal CLK, outputting, by the logic shift circuit 21, the signal from the second control signal terminal OE to a corresponding level modulation circuit 22 through a first node P1 within a clock cycle (from time instant M1 to time instant M5 in FIG. 9) where the rising edge locates, and shifting and outputting the signal of the second input signal terminal DIO to a next stage of logic shift circuit 21 through a second node P2.

It should be understood that the logic shift circuit 21 can be realized by any shift register unit, which will not be further defined here.

In addition, as shown in FIG. 9, a working process of the level modulation circuit 22 comprises: from time instant M1 to time instant M2, and from time instant M4 to time instant M5 in FIG. 9, in response to a low level signal from the second control signal terminal OE (i.e., a signal at the first node P1), outputting, by the level modulation circuit 22, the signal from the second power supply signal terminal VGL. From time instant M2 to time instant M4 in FIG. 9, in response to a high level signal from the second control signal terminal OE (i.e., the signal at the first node P1), outputting, by the level modulation circuit 22, the signal from the first output signal terminal GPM. From time instant M3 to time instant M4, corresponding to the corner cut waveform output by the first output terminal GPM, the waveform of the scanning signal is also corner cut.

The level modulation circuit 22 can be realized by any either-or circuit, for example, the level modulation circuit 22 can comprise P-type and N-type transistors whose gates are connected in parallel, the P-type and N-type transistors being turned on alternately under control of the signal at the first node P1, so as to realize selective output of the signal.

Still referring to FIG. 9, individual phases of outputting the corner cut scanning signal will be explained.

In response to the voltage of the second input signal terminal DIO being of a high level at a rising edge of the clock signal of the clock signal terminal CLK, the first phase starts. The following first phase to the fourth phase constitute a clock cycle where the rising edge locates.

In the first phase (time instant M1 to time instant M2), the low level signal from the second control signal terminal OE is outputted to a corresponding level modulation circuit 22, the level modulation circuit 22 outputs a signal from the second power supply signal terminal VGL through the second output signal terminal Output, and the signal is of a low level.

In the second phase (time instant M2 to time instant M3), the high level signal from the second control signal terminal OE is outputted to a corresponding level modulation circuit 22, and the level modulation circuit 22 outputs a signal from the first output signal terminal GPM through the second output signal terminal Output. Here, in the corner cutting circuit 1, in response to the high level signal from the first control signal terminal VOE, the first output signal terminal GPM outputs a high level signal.

In the third phase (time instant M3 to time instant M4), the high level signal from the second control signal terminal OE is outputted to a corresponding level modulation circuit 22, and the level modulation circuit 22 outputs a signal from the first output signal terminal GPM through the second output signal terminal Output. Here, in the corner cutting circuit 1, in response to the low level signal from the first control signal terminal VOE, a signal whose voltage value is smoothly reduced is outputted at the first output signal terminal GPM, and the voltage value of the signal is reduced to a voltage value of the first input signal terminal VGPM from a high level.

In the fourth phase (time instant M4 to time instant M5), the low level signal from the second control signal terminal OE is outputted to a corresponding level modulation circuit 22, and the level modulation circuit 22 outputs a signal from the second power supply signal terminal VGL, the signal being of a low level.

In embodiments of this disclosure, the corner cutting circuit 1 outputs the corner cut voltage signal to the scanning circuit 2, and the scanning circuit 2 comprises a plurality of logic shift circuits 21 and corresponding level modulation circuits 22. Compared to a conventional shift register circuit, only a corner cutting circuit 1 and a plurality of level modulation circuits 22 that can be realized by a few transistors are added, which will not increase the space required by the gate driving circuit.

Figure 10:
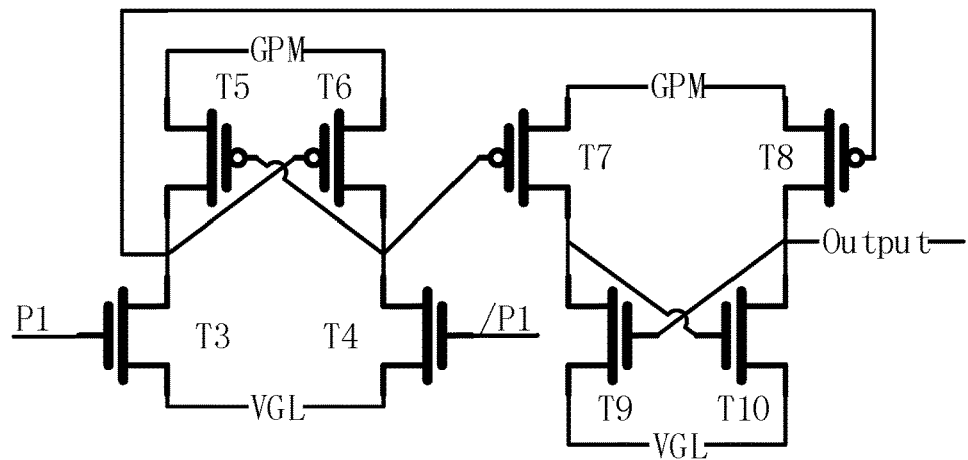
FIG. 10 is a structural schematic diagram of a level modulation circuit.

FIG. 10 is a structural schematic diagram of a level modulation circuit. As shown in FIG. 10, the level modulation circuit comprises a third transistor T3, a fourth transistor T4, a fifth transistor T5, a sixth transistor T6, a seventh transistor T7, an eighth transistor T8, a ninth transistor T9, and a tenth transistor T10.

A control pole of the third transistor T3 is connected with the first node P1; a first pole of the third transistor T3 is connected with a second pole of the fifth transistor T5, a control pole of the sixth transistor T6, and a control pole of the eighth transistor T8; a second pole of the third transistor T3 is connected with the second power supply signal terminal VGL.

A control pole of the fourth transistor T4 is connected with the first node P1 via an inverter; a first pole of the fourth transistor T4 is connected with a control pole of the fifth transistor T5, a second pole of the sixth transistor T6, and a control pole of the seventh transistor T7; a second pole of the fourth transistor T4 is connected with the second power supply signal terminal VGL.

A first pole of the fifth transistor T5 is connected with the first output signal terminal GPM. A first pole of the sixth transistor T6 is connected with the first output signal terminal GPM.

A first pole of the seventh transistor T7 is connected with the first output signal terminal GPM; a second pole of the seventh transistor T7 is connected with a first pole of the ninth transistor T9, and a control pole of the tenth transistor T10.

A first pole of the eighth transistor T8 is connected with the first output signal terminal GPM; a second pole of the eighth transistor T8 is connected with a control pole of the ninth transistor T9, a first pole of the tenth transistor T10, and the second output signal terminal Output.

A second pole of the ninth transistor T9 is connected with the second power supply signal terminal VGL. A second pole of the tenth transistor T10 is connected with the second power supply signal terminal VGL.

As an example, the third transistor T3, the fourth transistor T4, the ninth transistor T9, and the tenth transistor T10 are N-type transistors; the fifth transistor T5, the sixth transistor T6, the seventh transistor T7, and the eighth transistor T8 are P-type transistors.

When the first node P1 is of a high level, the control pole of the third transistor T3 is of a high level, and the third transistor T3 is turned on. Correspondingly, the fourth transistor T4 is cut off. The turn-on of the third transistor T3 enables the control poles of the sixth transistor T6 and the eighth transistor T8 to be of a low level from the second power supply signal terminal VGL, and the sixth transistor T6 and the eighth transistor T8 are turned on. After the eighth transistor T8 is turned on, the second output signal terminal Output is connected with the first output signal terminal GPM.

When the first node P1 is of a low level, the control pole of the fourth transistor T4 is of a high level, and the fourth transistor T4 is turned on. Correspondingly, the third transistor T3 is cut off. The turn-on of the fourth transistor T4 enables the control poles of the fifth transistor T5 and the seventh transistor T7 to be of a low level from the second power supply signal terminal VGL, and the fifth transistor T5 and the seventh transistor T7 are turned on. After the seventh transistor T7 is turned on, the control pole of the tenth transistor T10 is of a high level from the first output signal terminal GPM, and the tenth transistor T10 is turned on. The turn-on of the tenth transistor 10 enables the second output signal terminal Output to be connected with the second power supply signal terminal VGL.

Figure 11:
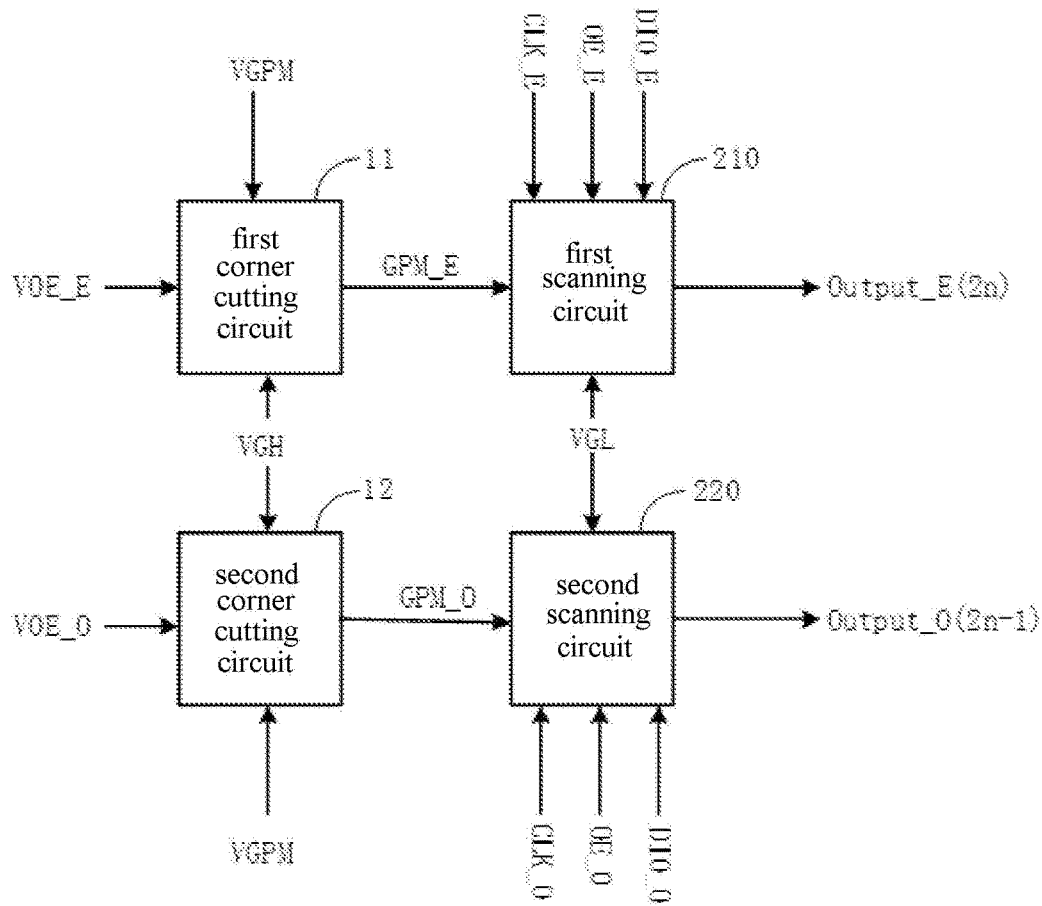
FIG. 11 is another structural schematic diagram of a gate driving circuit provided by an embodiment of this disclosure.

FIG. 11 is another structural schematic diagram of a gate driving circuit provided by an embodiment of this disclosure. As shown in FIG. 11, the corner cutting circuit 1 may specifically comprise a first corner cutting circuit 11 and a second corner cutting circuit 12. The scanning circuit 2 may specifically comprise a first scanning circuit 210 connected with the first corner cutting circuit 11, and a second scanning circuit 220 connected with the second corner cutting circuit 12. The first scanning circuit 210 can comprise a plurality of cascaded logic shift circuits 21 and corresponding level modulation circuits 22 located in even rows. The second scanning circuit 220 can comprise a plurality of cascaded logic shift circuits 21 and corresponding level modulation circuits 22 located in odd rows. In other words, the first corner cutting circuit 11 is connected to a plurality of cascaded level modulation circuits 22 located in even rows, and the second corner cutting circuit 22 is connected to a plurality of cascaded level modulation circuits 22 located in odd rows. In this way, by using the corner cut waveform in odd and even rows, the influence of the waveform of the scanning signal to the voltage of the data signal at the cut-off time instant due to the parasitic capacitance and the capacitance coupling effect can be further reduced.

For the corner cutting circuit, the first control signal terminal VOE_E connected with the first terminal of the first corner cutting circuit 11 inputs a first enable control signal thereto, the first input signal terminal VGPM connected with the second terminal inputs a first input signal thereto, the first power supply signal terminal VGH connected with the third terminal inputs a first power supply signal thereto, and the first output signal terminal GPM_E connected with the fourth terminal outputs a first output signal.

The first control signal terminal VOE_O connected with the second terminal of the second corner cutting circuit 12 inputs a second enable control signal thereto, the first input signal terminal VGPM connected with the second terminal inputs the first input signal thereto, the first power supply signal terminal VGH connected with the third terminal inputs the first power supply signal thereto, and the first output signal terminal GPM_O connected with the fourth terminal outputs a second output signal.

It can be understood that the first output signal terminal of the first corner cutting circuit 11 is GPM_E, the first output signal terminal of the second corner cutting circuit 12 is GPM_O, and signals outputted by the first output signal terminals of the first corner cutting circuit 11 and the second corner cutting circuit 12 are different. The first control signal terminal of the first corner cutting circuit 11 is VOE_E, the first control signal terminal of the second corner cutting circuit 12 is VOE_O, and enable control signals inputted by the first control signal terminals of the first corner cutting circuit 11 and the second corner cutting circuit 12 are different.

Here, the first corner cutting circuit 11 and the second corner cutting circuit 12 correspond to enable control signals inputted by two different first control signal terminals VOE, which are respectively the first enable control signal inputted by VOE_E and the second enable control signal inputted by VOE_O. Since the enable control signals inputted by the first control signal terminals VOE connected with the first terminals of the first corner cutting circuit 11 and the second corner cutting circuit 12 are different, when the enable control signals inputted by the first terminals of the first corner cutting circuit 11 and the second corner cutting circuit 12 are delayed, it will cause the signals outputted by the first output signal terminals GPM connected with the first corner cutting circuit 11 and the second corner cutting circuit 12 to be delayed, which are the first output signal outputted by GPM_E and the second output signal outputted by GPM_O respectively. Further, since the first corner cutting circuit 11 is connected with a plurality of cascaded logic shift circuits 21 and corresponding level modulation circuits 22 located in even rows, and the second corner cutting circuit 12 is connected with a plurality of cascaded logic shift circuits 21 and corresponding level modulation circuits 22 located in odd rows, corner cut waveforms in different odd and even rows can be realized.

For the scanning circuit, the first output signal terminal GPM_E connected with the first terminal of the first scanning circuit 210 (which comprises a plurality of cascaded logic shift circuits 21 and corresponding level modulation circuits 22 located in even rows) inputs a first output signal thereto, the clock signal terminal CLK_E connected with the second terminal inputs a first clock signal thereto, the second input signal terminal DIO_E connected with the third terminal inputs a second input signal thereto, the second control signal terminal OE_E connected with the fourth terminal inputs a third enable control signal thereto, the second power supply signal terminal VGL connected with the fifth terminal inputs a second power supply signal thereto, and the second output signal terminal Output_E connected with the sixth terminal outputs a third output signal.

The first output signal terminal GPM_O connected with the first terminal of the second scanning circuit 220 (which comprises a plurality of cascaded logic shift circuits 21 and corresponding level modulation circuits 22 located in odd rows) inputs a second output signal thereto, the clock signal terminal CLK_O connected with the second terminal inputs a second clock signal thereto, the second input signal terminal DIO_O connected with the third terminal inputs a third input signal thereto, the second control signal terminal OE_O connected with the fourth terminal inputs a fourth enable control signal thereto, the second power supply signal terminal VGL connected with the fifth terminal inputs a second power supply signal, and the second output signal terminal Output_O connected with the sixth terminal outputs a fourth output signal.

Here, the first scanning circuit 210 and the second scanning circuit 220 correspond to clock signals inputted by two different clock signal terminals CLK, which are respectively the first clock signal inputted by CLK_E and the second clock signal inputted by CLK_O, and further control the second clock signals of different rows of logic shift circuits 21 and corresponding level modulation circuits 22 respectively. The first scanning circuit 210 and the second scanning circuit 220 correspond to input signals of two different second input signal terminals DIO, which are respectively the second input signal inputted by DIO_E and the third input signal inputted by DIO_O, and control input signals of different rows of logic shift circuits 21 and corresponding level modulation circuits 22 respectively. The first scanning circuit 210 and the second scanning circuit 220 correspond to enable control signals inputted by two different second control signal terminals OE, which are respectively the third enable control signal inputted by OE_E and the fourth enable control signal inputted by OE_O, and further control enable control signals of different rows of logic shift circuits 21 and corresponding level modulation circuits 22 respectively. Since the signals inputted by the first output signal terminal, the clock signal terminal, the second input signal terminal and the second control signal terminal connected with the first scanning circuit 210 and the second scanning circuit 220 to them may all be different, the signals outputted by the second output signal terminals connected with the first scanning circuit 210 and the second scanning circuit 220 are rendered different, so as to realize corner cut waveforms in different odd and even rows.

Figure 12:
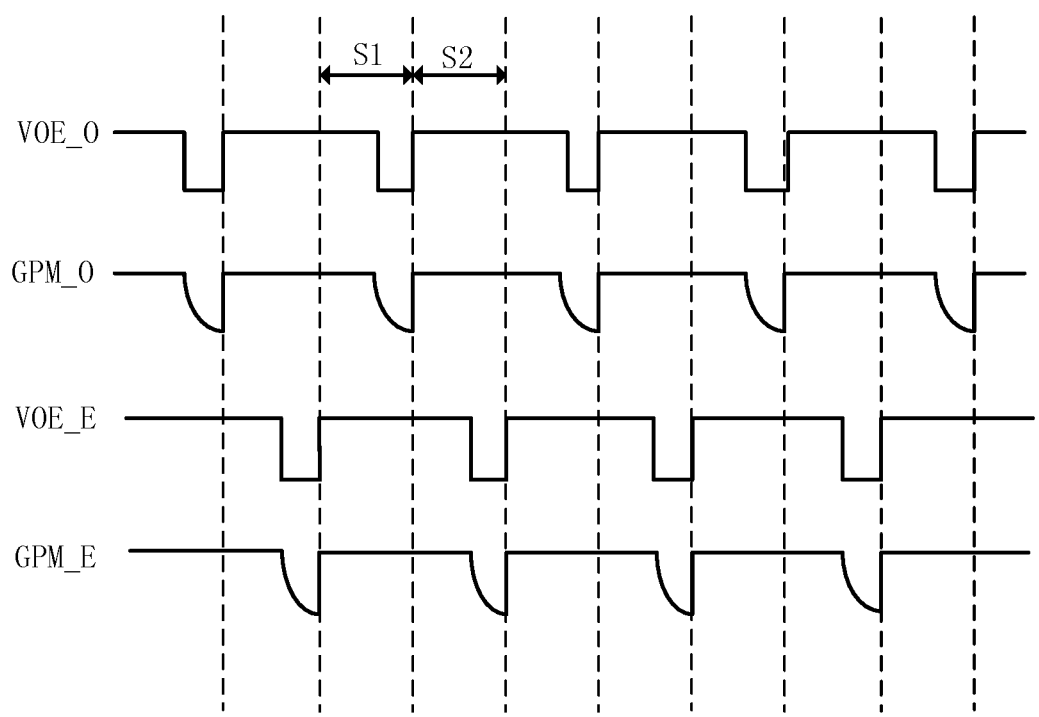
FIG. 12 is a timing diagram of a corner cutting circuit as shown in FIG. 11.

FIG. 12 is a timing diagram of the corner cutting circuit as shown in FIG. 11. As shown in FIG. 12, for the second corner cutting circuit, if the first control signal terminal VOE_O is of a high level, the first output signal terminal GPM_O outputs a voltage of the first power supply signal terminal VGH. If the first control signal terminal VOE_O is of a low level, the output voltage of the first output signal terminal GPM_O will begin to drop, which enters a stable state after dropping to a certain value. The corner cut voltage value outputted by the first output signal terminal GPM_O can be determined by an externally set voltage of the first input signal terminal VGPM, and the waveform realized is as shown in the time period S1 in FIG. 11. Similarly, for the first corner cutting circuit, if the first control signal terminal VOE_E is of a high level, the first output signal terminal GPM_E will output a voltage of the first power supply signal terminal VGH. If the first control signal terminal VOE_E is of a low level, the output voltage of the first output signal terminal GPM_E will begin to drop, which enters a stable state after dropping to a certain value. The corner cut voltage value outputted by GPM_E can be determined by an externally set voltage of the first input signal terminal VGPM, and the waveform realized is as shown in the time period S2 in FIG. 11. The alternation of S1 and S2 generates alternating corner cut waveforms of GPM_O and GPM_E.

Figure 13:
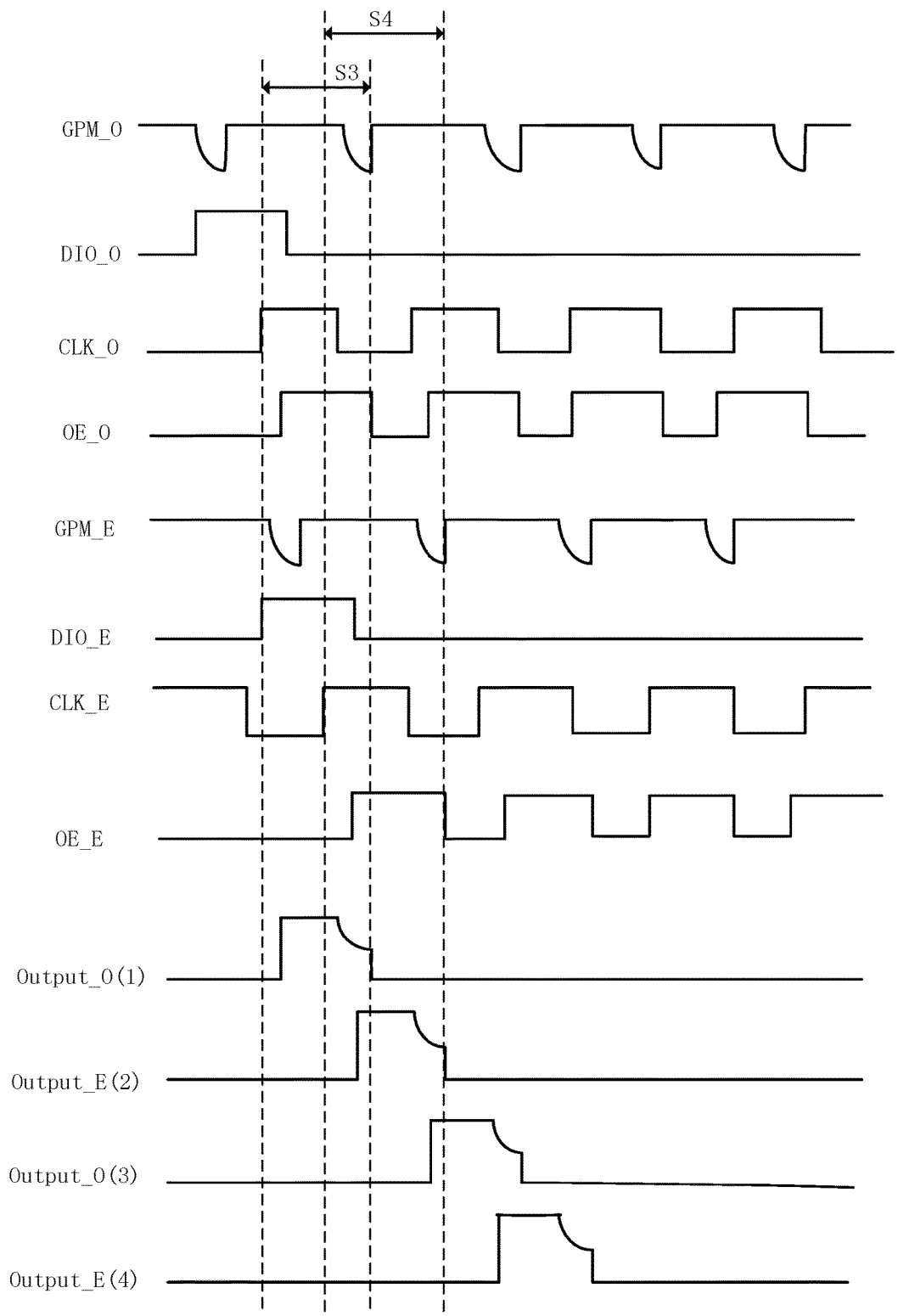
FIG. 13 is a timing diagram of a scanning circuit as shown in FIG. 11.

FIG. 13 is a timing diagram of the scanning circuit as shown in FIG. 11. As shown in FIG. 13, for the second scanning circuit, an initial signal inputted by the second input signal terminal DIO_O is received firstly. A rising edge of the clock signal inputted by the output clock signal terminal CLK_O being received within the initial signal means that, output of Output_O(1) will be performed to the first row scanned by the second output signal terminal Output_O($2n-1$), wherein n represents any natural number. Here, if the second control signal terminal OE_O is of a low level, the Output_O(1) will be of a low gate driving voltage VGL. If the second control signal terminal OE_O here is of a high level, the voltage of the Output_O(1) will be the voltage value of the first output signal terminal GPM_O. A next rising edge of the clock signal inputted at the clock signal terminal CLK_O means that output of Output_O(3) will be performed to the second row scanned by the second output signal terminal Output_O($2n-1$), meanwhile, the Output_O(1) will be controlled to output a low gate driving voltage VGL all the time. The waveform diagram so realized is as shown in the phase of S3 in FIG. 12. Similarly, for the first scanning circuit, an initial signal inputted by the second input signal terminal DIO_E is received firstly. A rising edge of the clock signal inputted by the output clock signal terminal CLK_E being received within the initial signal means that, the output of Output_E(2) will be performed to the first row scanned by the second output signal terminal Output_E($2n$). If the second control signal terminal OE_E here is of a low level, the Output_E(2) will be of a low gate driving voltage VGL. If the second control signal terminal OE_E here is of a high level, the voltage of the Output_E(2) will be the voltage value of the first output signal terminal GPM_E. A next rising edge of the clock signal inputted at the clock signal terminal CLK_E means that, output of Output_O(4) will be performed to the second row scanned by the second output signal terminal Output_E($2n$), meanwhile, the Output_O(2) will be controlled to output a low gate driving voltage VGL all the time. The waveform diagram so realized is as shown in the phase of S4 in FIG. 12. The output signal Output_O($2n-1$) of the second scanning circuit and the output signal Output_E($2n$) of the first scanning circuit are outputted alternately so as to generate ordered corner cut scanning signals.

In embodiments of this disclosure, by using the corner cut waveform in odd and even rows, the influence of the waveform of the scanning signal to the voltage of the data signal at the cut-off time instant due to the parasitic capacitance and the capacitance coupling effect can be further reduced.

An embodiment of this disclosure further provides a driving method of the gate driving circuit provided by an embodiment of this disclosure. Since the principle of the method for solving problems is similar as the preceding gate driving circuit, the implementation of this method can make reference to the implementation of the gate driving circuit, which will not be repeated here.

An embodiment of this disclosure further provides a display panel, comprising the gate driving circuit provided by embodiments of this disclosure.

An embodiment of this disclosure further provides a display device, comprising the display panel provided by the embodiment of this disclosure. The display device can be any product or component with the display function such as a mobile phone, a panel computer, a television, a display, a laptop, a digital photo frame, a navigator etc. Other essential composite parts of the display device all should be possessed as understood by the ordinary skilled person in the art, which will be not repeated here, and should not be regarded as limitations to this disclosure. The implementation of the display device can make reference to the embodiments of the gate driving circuit and the display panel, which will not be repeated here.

Embodiments of this disclosure provide a gate driving circuit, a driving method thereof, a display panel and a display device. The corner cutting circuit and the scanning circuit cooperate with each other, so as to enable the waveform of the scanning signal to be a corner cut waveform, which reduces influence caused by the waveform of the scanning signal to the voltage of the data signal due to the capacitance coupling effect of the parasitic capacitance between the TFTs at the cut-off time instant, prolonging the charging time of the data signal provided by the data line to the storage capacitor, thereby improving image quality, and can be used in a display device of a high resolution.

Apparently, the skilled person in the art can make various amendments and modifications to this disclosure without departing from the spirit and the scope of this disclosure. In this way, provided that these amendments and modifications fall in the scope of the claims of this disclosure and equivalences thereof, this disclosure also intends to encompass these amendments and modifications.

The invention claimed is:

1. A gate driving circuit, comprising:
a corner cutting circuit, configured to output a corner cut voltage signal, wherein the corner cut voltage signal comprises a pulse whose edge is smoothed; and
a scanning circuit, configured to output a corner cut scanning signal based on the corner cut voltage signal, wherein the corner cut scanning signal comprises a pulse whose edge is smoothed,
wherein a first terminal of the corner cutting circuit is connected with a first control signal terminal, a second terminal of the corner cutting circuit is connected with a first input signal terminal, a third terminal of the corner cutting circuit is connected with a first power supply signal terminal, a fourth terminal of the corner cutting circuit is connected with a first output signal terminal, a fifth terminal of the corner cutting circuit is grounded, and a sixth terminal of the corner cutting circuit is connected with the first output signal terminal,
wherein the corner cutting circuit is configured to control the first output signal terminal to output the corner cut voltage signal based on a signal from the first input signal terminal and a signal from the first power supply signal terminal under control of a signal from the first control signal terminal and a signal from the sixth terminal, such that a value of the corner cut voltage signal is not less than that of the signal from the first input signal terminal.

2. The gate driving circuit according to claim 1, wherein, a first terminal of the scanning circuit is connected with the first output signal terminal of the corner cutting circuit, a second terminal of the scanning circuit is connected with a clock signal terminal, a third terminal of the scanning circuit is connected with a second input signal terminal, a fourth terminal of the scanning circuit is connected a second control signal terminal, a fifth terminal of the scanning circuit is connected with a second power supply signal terminal, a sixth terminal of the scanning circuit is connected with a second output signal terminal; the scanning circuit is configured to control the second output signal terminal to output the corner cut scanning signal based on the corner cut voltage signal outputted by the first output signal terminal under control of signals from the clock signal terminal, the second control signal terminal and the second input signal terminal.

3. The gate driving circuit according to claim 2, wherein the corner cutting circuit comprises: a comparator, an XOR gate circuit, a first switch transistor, a second switch transistor and a resistor, wherein,
a first input terminal of the comparator is connected with the first input signal terminal, a second input terminal of the comparator is connected with the first output signal terminal, an output terminal of the comparator is connected with a first input terminal of the XOR gate circuit;
a second input terminal of the XOR gate circuit is connected with the first control signal terminal and a control pole of the first switch transistor, an output terminal of the XOR gate circuit is connected with a control pole of the second switch transistor;
a first pole of the first switch transistor is connected with the first power supply signal terminal, a first pole of the second switch transistor is connected with a second pole of the first switch transistor and the first output signal terminal respectively, one terminal of the resistor is connected with a second pole of the second switch transistor, and the other terminal of the resistor is connected to the ground.

4. The gate driving circuit according to claim 3, wherein the scanning circuit comprises a plurality of cascaded logic shift circuits, and a plurality of level modulation circuits connected with the plurality of logic shift circuits correspondingly;
each of the plurality of logic shift circuits is configured to, in response to a signal from the second input signal terminal and a clock signal from the clock signal terminal, output a signal from the second control signal terminal to a corresponding level modulation circuit, and shift and output the signal from the second input signal terminal to a next stage of logic shift circuit;
each of the plurality of level modulation circuit is configured to, in response to the signal from the second control signal terminal, selectively output a signal from the first output signal terminal or from the second power supply signal terminal.

5. The gate driving circuit according to claim 4, wherein the corner cutting circuit comprises a first corner cutting circuit and a second corner cutting circuit; the scanning circuit comprises a first scanning circuit connected with the first corner cutting circuit, and a second scanning circuit connected with the second corner cutting circuit; wherein,
the first scanning circuit comprises a plurality of cascaded logic shift circuits and corresponding level modulation circuits located in even rows;
the second scanning circuit comprises a plurality of cascaded logic shift circuits and corresponding level modulation circuits located in odd rows.

6. The gate driving circuit according to claim 5, wherein a first terminal of the first corner cutting circuit inputs a first enable control signal, a second terminal of the first corner cutting circuit inputs a first input signal, a third terminal of the first corner cutting circuit input a first power supply signal, a fourth terminal of the first corner cutting circuit outputs a first output signal;
a first terminal of the second corner cutting circuit inputs a second enable control signal, a second terminal of the second corner cutting circuit inputs the first input signal, a third terminal of the second corner cutting circuit input the first power supply signal, a fourth terminal of the second corner cutting circuit outputs a second output signal.

7. The gate driving circuit according to claim 6, wherein a first terminal of the first scanning circuit inputs the first output signal, a second terminal of the first scanning circuit inputs a first clock signal, a third terminal of the first scanning circuit inputs a second input signal, a fourth terminal of the first scanning circuit inputs a third enable control signal, a fifth terminal of the first scanning circuit inputs a second power supply signal, a sixth terminal of the first scanning circuit outputs a third output signal;

a first terminal of the second scanning circuit inputs the second output signal, a second terminal of the second scanning circuit inputs a second clock signal, a third terminal of the second scanning circuit inputs a third input signal, a fourth terminal of the second scanning circuit inputs a fourth enable control signal, a fifth terminal of the second scanning circuit inputs the second power supply signal, a sixth terminal of the second scanning circuit outputs a fourth output signal.

8. A driving method for the gate driving circuit according to claim 1, comprising:

controlling, by the corner cutting circuit, the first output signal terminal to output the corner cut voltage signal based on the signal from the first input signal terminal and the signal from the first power supply signal terminal under control of the signal from the first control signal terminal and the signal from the sixth terminal;

controlling, by the scanning circuit, the second output signal terminal to output the corner cut scanning signal based on the corner cut voltage signal outputted by the first output signal terminal under control of signals from the clock signal terminal, the second control signal terminal and the second input signal terminal.

9. The driving method according to claim 8, wherein, outputting the corner cut voltage signal comprises:

in response to a high level signal from the first control signal terminal, outputting a high level signal at the first output signal terminal;

in response to a low level signal from the first control signal terminal, outputting a signal whose voltage value is smoothly reduced at the first output signal terminal, the voltage value of the signal being reduced from a high level to a voltage value of the first input signal terminal.

10. The driving method according to claim 9, wherein, outputting the corner cut scanning signal comprises:

in response to the voltage of the second input signal terminal being of a high level at a rising edge of a clock signal of the clock signal terminal, outputting, by the logic shift circuit, a signal from the second control signal terminal to a corresponding level modulation circuit within a clock cycle where the rising edge locates, and shifting and outputting the signal of the second input signal terminal to a next stage of logic shift circuit;

in response to a low level signal from the second control signal terminal, outputting, by the level modulation circuit, a signal from the second power supply signal terminal, and in response to a high level signal from the second control signal terminal, outputting, by the level modulation circuit, a signal from the first output signal terminal.

11. The driving method according to claim 10, wherein outputting the corner cut scanning signal comprises:

in a first phase, the low level signal from the second control signal terminal is outputted to a corresponding level modulation circuit, and the level modulation circuit outputs the signal from the second power supply signal terminal;

in a second phase, the high level signal from the second control signal terminal is outputted to a corresponding level modulation circuit, and the level modulation circuit outputs the signal from the first output signal terminal, wherein in response to the high level signal from the first control signal terminal, a high level signal is outputted at the first output signal terminal;

in a third phase, the high level signal from the second control signal terminal is outputted to a corresponding level modulation circuit, and the level modulation circuit outputs the signal from the first output signal terminal, wherein in response to the low level signal from the first control signal terminal, the signal whose voltage value is smoothly reduced is outputted at the first output signal terminal, the voltage value of the signal being reduced from a high level to the voltage value of the first input signal terminal;

in a fourth phase, the low level signal from the second control signal terminal is outputted to a corresponding level modulation circuit, and the level modulation circuit outputs the signal from the second power supply signal terminal, wherein, in response to the voltage of the second input signal terminal being of a high level at the rising edge of the clock signal of the clock signal terminal, the first phase starts; and the first phase to the fourth phase constitute a clock cycle where the rising edge locates.

12. The driving method according to claim 11, wherein the corner cutting circuit comprises a first corner cutting circuit and a second corner cutting circuit; the scanning circuit comprises a first scanning circuit connected with the first corner cutting circuit, and a second scanning circuit connected with the second corner cutting circuit, wherein, the first scanning circuit comprises a plurality of cascaded logic shift circuits and corresponding level modulation circuits located in even rows; the first scanning circuit controls the second output signal terminal to output the corner cut scanning signal row by row in all even rows based on the corner cut voltage signal outputted by the first output signal terminal controlled by the first corner cutting circuit under control of signals from the clock signal terminal, the second control signal terminal and the second input signal terminal;

the second scanning circuit comprises a plurality of cascaded logic shift circuits and corresponding level modulation circuits located in odd rows; the second scanning circuit controls the second output signal terminal to output the corner cut scanning signal row by row in all odd rows based on the corner cut voltage signal outputted by the first output signal terminal controlled by the second corner cutting circuit under control of signals from the clock signal terminal, the second control signal terminal and the second input signal terminal.

13. A display panel, comprising the gate driving circuit according to claim 1.

14. A display device, comprising the display panel according to claim 13.

15. The display panel according to claim 13, wherein, a first terminal of the scanning circuit is connected with the first output signal terminal of the corner cutting circuit, a second terminal of the scanning circuit is connected with a clock signal terminal, a third terminal of the scanning circuit is connected with a second input signal terminal, a fourth terminal of the scanning circuit is connected a second control signal terminal, a fifth terminal of the scanning circuit is connected with a second power supply signal terminal, a sixth terminal of the scanning circuit is connected with a second output signal terminal; the scanning circuit is configured to control the second output signal terminal to output the corner cut scanning signal based on the corner cut voltage signal outputted by the first output signal terminal under control of signals from the clock signal terminal, the second control signal terminal and the second input signal terminal.

16. The display panel according to claim 15, wherein the corner cutting circuit comprises: a comparator, an XOR gate circuit, a first switch transistor, a second switch transistor and a resistor, wherein,
- a first input terminal of the comparator is connected with the first input signal terminal, a second input terminal of the comparator is connected with the first output signal terminal, an output terminal of the comparator is connected with a first input terminal of the XOR gate circuit;
- a second input terminal of the XOR gate circuit is connected with the first control signal terminal and a control pole of the first switch transistor, an output terminal of the XOR gate circuit is connected with a control pole of the second switch transistor;
- a first pole of the first switch transistor is connected with the first power supply signal terminal, a first pole of the second switch transistor is connected with a second pole of the first switch transistor and the first output signal terminal respectively, one terminal of the resistor is connected with a second pole of the second switch transistor, and the other terminal of the resistor is connected to the ground.

17. The display panel according to claim 16, wherein the scanning circuit comprises a plurality of cascaded logic shift circuits, and a plurality of level modulation circuits connected with the plurality of logic shift circuits correspondingly;
- each of the plurality of logic shift circuits is configured to, in response to a signal from the second input signal terminal and a clock signal from the clock signal terminal, output a signal from the second control signal terminal to a corresponding level modulation circuit, and shift and output the signal from the second input signal terminal to a next stage of logic shift circuit;
- each of the plurality of level modulation circuit is configured to, in response to the signal from the second control signal terminal, selectively output a signal from the first output signal terminal or from the second power supply signal terminal.

18. The display panel according to claim 17, wherein the corner cutting circuit comprises a first corner cutting circuit and a second corner cutting circuit; the scanning circuit comprises a first scanning circuit connected with the first corner cutting circuit, and a second scanning circuit connected with the second corner cutting circuit; wherein,
- the first scanning circuit comprises a plurality of cascaded logic shift circuits and corresponding level modulation circuits located in even rows;
- the second scanning circuit comprises a plurality of cascaded logic shift circuits and corresponding level modulation circuits located in odd rows.

19. The display panel according to claim 18, wherein a first terminal of the first corner cutting circuit inputs a first enable control signal, a second terminal of the first corner cutting circuit inputs a first input signal, a third terminal of the first corner cutting circuit input a first power supply signal, a fourth terminal of the first corner cutting circuit outputs a first output signal;
- a first terminal of the second corner cutting circuit inputs a second enable control signal, a second terminal of the second corner cutting circuit inputs the first input signal, a third terminal of the second corner cutting circuit input the first power supply signal, a fourth terminal of the second corner cutting circuit outputs a second output signal.

20. The display panel according to claim 19, wherein a first terminal of the first scanning circuit inputs the first output signal, a second terminal of the first scanning circuit inputs a first clock signal, a third terminal of the first scanning circuit inputs a second input signal, a fourth terminal of the first scanning circuit inputs a third enable control signal, a fifth terminal of the first scanning circuit inputs a second power supply signal, a sixth terminal of the first scanning circuit outputs a third output signal;
- a first terminal of the second scanning circuit inputs the second output signal, a second terminal of the second scanning circuit inputs a second clock signal, a third terminal of the second scanning circuit inputs a third input signal, a fourth terminal of the second scanning circuit inputs a fourth enable control signal, a fifth terminal of the second scanning circuit inputs the second power supply signal, a sixth terminal of the second scanning circuit outputs a fourth output signal.

* * * * *